United States Patent
Breuer et al.

(10) Patent No.: US 11,127,674 B2
(45) Date of Patent: Sep. 21, 2021

(54) BACK END OF THE LINE METAL STRUCTURE AND METHOD

(71) Applicant: GLOBALFOUNDRIES U.S. INC., Malta, NY (US)

(72) Inventors: Dirk Breuer, Dresden (DE); Oliver M. Witnik, Moritzburg (DE); Carla Byloos, Dresden (DE); Holger S. Schuehrer, Dresden (DE)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 16/654,059

(22) Filed: Oct. 16, 2019

(65) Prior Publication Data

US 2021/0118796 A1 Apr. 22, 2021

(51) Int. Cl.
| | |
|---|---|
| *H01L 23/522* | (2006.01) |
| *H01L 23/532* | (2006.01) |
| *H01L 21/768* | (2006.01) |
| *H01L 23/528* | (2006.01) |

(52) U.S. Cl.
CPC .... *H01L 23/5226* (2013.01); *H01L 21/76804* (2013.01); *H01L 21/76877* (2013.01); *H01L 23/5283* (2013.01); *H01L 23/53219* (2013.01); *H01L 23/53228* (2013.01)

(58) Field of Classification Search
CPC ............... H01L 23/522; H01L 23/5226; H01L 23/53228; H01L 23/5283; H01L 21/76804–76807; H01L 21/76877
See application file for complete search history.

(56) References Cited

U.S. PATENT DOCUMENTS

| | | | | |
|---|---|---|---|---|
| 5,070,037 | A | * | 12/1991 | Leisure ............... H01L 23/5329 438/624 |
| 6,335,561 | B2 | | 1/2002 | Imoto |
| 6,417,575 | B2 | | 7/2002 | Harada et al. |
| 7,263,677 | B1 | | 8/2007 | Teig et al. |
| 9,627,250 | B2 | | 4/2017 | Wu et al. |
| 9,917,027 | B2 | | 3/2018 | Yi et al. |
| 10,276,378 | B1 | | 4/2019 | Wu et al. |
| 2003/0023937 | A1 | | 1/2003 | McManus et al. |
| 2005/0273748 | A1 | | 12/2005 | Hetzel et al. |
| 2006/0063371 | A1 | * | 3/2006 | Lin ................... H01L 21/76885 438/618 |

(Continued)

*Primary Examiner* — John A Bodnar
(74) *Attorney, Agent, or Firm* — Gibb & Riley, LLC; Anthony J. Canale

(57) ABSTRACT

Disclosed are embodiments of a back end of the line (BEOL) metal structure that includes, within a metal level, a metal via, which has at least eight sides and all interior angles at 135° or more, and a metal wire thereon. The metal wire and via include respective portions of a continuous conformal metal layer. A passivation layer coats the top surface of the metal layer. The metal via and the metal wire thereon can be in an upper metal level and can be made of one metal (e.g., aluminum or an aluminum alloy). The upper metal level can be above a lower metal level that similarly includes a metal via and metal wire thereon, but the metal used can be different (e.g., copper) and/or the shape of the via can be different (e.g., four-sided). Also disclosed herein are method embodiments for forming the above-described BEOL metal structure.

20 Claims, 13 Drawing Sheets

(56) References Cited

U.S. PATENT DOCUMENTS

| | | | |
|---|---|---|---|
| 2006/0063378 A1* | 3/2006 | Lin | H01L 21/76885 |
| | | | 438/642 |
| 2010/0007030 A1* | 1/2010 | Koike | H01L 23/481 |
| | | | 257/774 |
| 2012/0319237 A1 | 12/2012 | Cooney, III et al. | |
| 2013/0320522 A1* | 12/2013 | Lai | H01L 23/562 |
| | | | 257/737 |
| 2017/0236792 A1 | 8/2017 | Lee et al. | |
| 2018/0342473 A1 | 11/2018 | Lu et al. | |

* cited by examiner

BACK END OF THE LINE METAL STRUCTURE AND METHOD

BACKGROUND

Field of the Invention

The present invention relates to back end of the line (BEOL) metal structures and, more particularly, to embodiments of a BEOL metal structure including a metal wire and robust metal via and a method of forming the metal structure.

Description of Related Art

In conventional back end of the line (BEOL) processing, multiple metal levels (e.g., $M_0$ to $M_x$) are formed on a semiconductor wafer above an active device layer (e.g., a semiconductor layer, such as a silicon layer). Each metal level includes one or more layers of interlayer dielectric (ILD) material and metal structures embedded within the ILD material. The metal structures can include, but are not limited to, passive metal devices (e.g., resistors and capacitors) and metal interconnect structures. The metal interconnect structures provide the electrical connections between on-chip devices and from on-chip devices to off-chip components (e.g., through input/output pins). The metal interconnect structures can include metal wires (also referred to herein as metal lines), which are oriented essentially parallel to the wafer surface (i.e., horizontally). The metal interconnect structures can also include metal vias, which are oriented essentially perpendicular to the wafer surface (i.e., vertically), are typically drawn square in shape (as viewed in a horizontal cross-section), and extend from the bottom of one metal line downward through ILD material layer(s) to the top of another metal line. Various different metal materials are known in the art for use in these BEOL interconnect structures including, but not limited to, copper and aluminum. Those skilled in the art will recognize that the deposition techniques employed during formation of such BEOL interconnect structures will vary depending upon the type of metal materials used. For example, the optimal technique currently employed for copper deposition is electroplating, whereas the optimal technique currently employed for aluminum deposition is a conformal deposition process. The different deposition techniques pose different challenges during manufacturing.

SUMMARY

Disclosed herein are embodiments of a back end of the line (BEOL) metal structure. The BEOL metal structure can include a BEOL metal level and, within the BEOL metal level, a metal via, which has at least eight sides and all interior angles at 135° or more, and a metal wire thereon. The metal via and the metal wire can include respective portions of the same continuous conformal metal layer. A passivation layer can coat the top surface of the metal layer. In some embodiments, this metal via and the metal wire thereon can be in an upper BEOL metal level and can be made of one type of metal (e.g., aluminum or an aluminum alloy). In some embodiments, the upper BEOL metal level can be above a lower BEOL metal level that similarly includes a metal via with eight or more sides and a metal wire thereon, but the metal used can be different (e.g., copper as opposed to aluminum or an aluminum alloy) and/or the shape of the via can be different (e.g., a four-sided metal via as opposed to an eight or more sided metal via). Also disclosed herein are method embodiments for forming the above-described BEOL metal structure.

Specifically, disclosed herein are embodiments of a BEOL metal structure that includes a BEOL metal level. The BEOL metal level can include a dielectric layer (e.g., a single layer or multiple layers of interlayer dielectric (ILD) material). The dielectric layer can have a first surface and a second surface opposite the first surface. A metal via can extend through the dielectric layer from the second surface down to the first surface. The metal via can have at least eight sides and, more particularly, can have a shape with at least eight sides, where each interior angle at each junction between adjacent sides is at least 135°. For example, the shape of the metal via could be an octagon, a nonagon, a decagon, etc. A metal wire can be on the second surface of the dielectric layer and electrically connected to the metal via. As discussed in greater detail below with regard to the method embodiments, one or more of the process steps used to form the metal via and the metal wire can be performed concurrently including, but not limited to, a conformal metal deposition process. Thus, the metal via and the metal wire can have a shared metal layer and, more particularly, can include respective portions of a continuous conformal metal layer. That is, a first portion of the metal layer for the metal via with eight or more sides can line a via opening (which has eight or more sides, where each interior angle at each junction between adjacent sides is at least 135°) and a second portion of the metal layer for the metal wire can be above the second surface of the dielectric layer. A passivation layer can coat the top surface of the metal layer.

Also disclosed herein are embodiments of a BEOL metal structure that includes multiple BEOL metal levels. The multiple BEOL metal levels can include a lower BEOL metal level and an upper BEOL metal level above the lower BEOL level. The lower BEOL metal level can include a lower dielectric layer (e.g., a single layer or multiple layers of ILD material) and, embedded in the lower dielectric layer, a first metal via having a first shape (e.g., a four-sided shape, such as a square shape or a rectangle shape; a round shape; etc.) and a first metal wire thereon. The first metal via and the first metal wire can be made with a first metal material (e.g., copper). The upper BEOL metal level can include an upper dielectric layer (e.g., a single layer or multiple layers of interlayer dielectric (ILD) material). The upper dielectric layer can have a first surface and a second surface opposite the first surface. The upper BEOL metal level can further include a second metal via with a second shape that is different from the first shape and that has at least eight sides, wherein each interior angle at each junction between adjacent sides is at least 135°. For example, the second shape of the second metal via can be an octagon shape, a nonagon shape, a decagon shape, etc. The second metal via can extend through the upper dielectric layer from the second surface down to the first surface. A second metal wire can be on the second surface of the upper dielectric layer and electrically connected to the second metal via. The second metal via and the second metal wire can have a shared metal layer and, more particularly, can include respective portions of a continuous conformal metal layer. The conformal metal layer can be a second metal material (e.g., aluminum or an aluminum alloy) that is different from the first metal material. Thus, the first metal via and first metal wire in the lower BEOL metal level are made of a different metal than the second metal via and the second metal wire of the upper BEOL metal level. A passivation layer can coat the top surface of the conformal metal layer in the upper BEOL metal level.

Also disclosed herein are method embodiments for forming the above-described BEOL metal structure embodiments. The method can include forming a BEOL metal level. To form the BEOL metal level, a dielectric layer (e.g., a single layer or multiple layers of interlayer dielectric (ILD) material) can be formed. The dielectric layer can have a first surface and a second surface opposite the first surface. A via opening can be formed in the dielectric layer such that it extends from the second surface down to the first surface and such that it has a shape with at least eight sides, where each interior angle at each junction between adjacent sides is at least 135°. A metal via can be formed within this eight or more sided via opening and a metal wire can be formed on the second surface of the dielectric layer and electrically connected to the metal via. One or more of the process steps used to form the metal via and the metal wire can be performed concurrently including, but not limited to, a conformal metal deposition process (e.g., physical vapor deposition (PVD)) such that the metal via and the metal wire include respective portions of a continuous conformal metal layer. A passivation layer can subsequently be formed (e.g., by chemical vapor deposition (CVD)) so as to coat exposed surfaces of the metal layer.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1A:
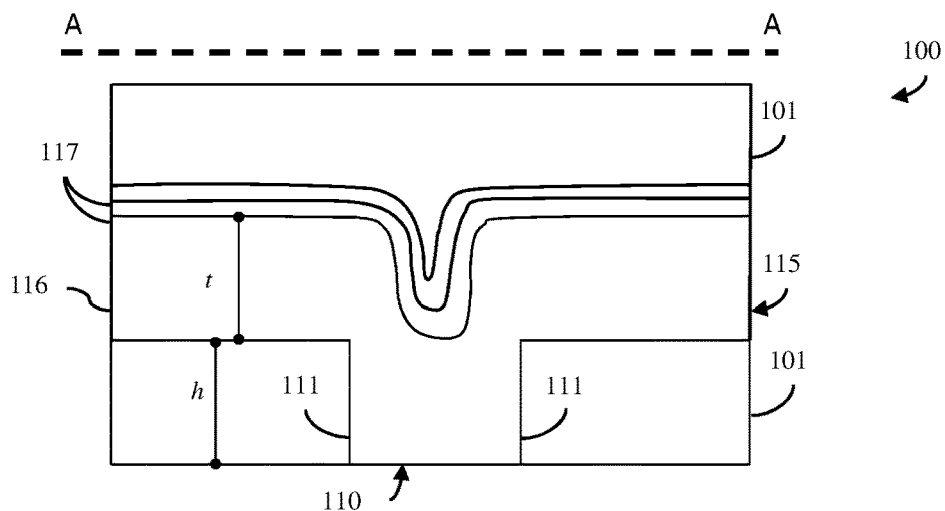
FIGS. 1A and 1B are cross-section diagrams illustrating a prior art BEOL metal structure and FIG. 1C is a perspective diagram showing the relative locations of the different vertical cross-sections A-A and B-B and the shape of the metal via therein.

As mentioned above, in conventional back end of the line (BEOL) processing, multiple metal levels (e.g., $M_0$ to $M_x$) are formed on a semiconductor wafer above an active device layer (e.g., a semiconductor layer, such as a silicon layer). Each metal level includes one or more layers of interlayer dielectric (ILD) material and metal structures embedded within the ILD material. The metal structures can include, but are not limited to, passive metal devices (e.g., resistors and capacitors) and metal interconnect structures. The metal interconnect structures provide the electrical connections between on-chip devices and from on-chip devices to off-chip components (e.g., through input/output pins). The metal interconnect structures can include metal wires (also referred to herein as metal lines), which are oriented essentially parallel to the wafer surface (i.e., horizontally). The metal interconnect structures can also include metal vias, which are oriented essentially perpendicular to the wafer surface (i.e., vertically), are typically drawn square in shape (as viewed in a horizontal cross-section), and extend from the bottom of one metal line downward through ILD material layer(s) to the top of another metal line. Those skilled in the art will recognize that typically the dimensions (e.g., height and width) of the metal wires and the dimensions (e.g., height, width and depth) of the metal vias are generally smaller in lower metal levels than they are in the upper metal levels. Furthermore, due to optical proximity correction (OPC) processing, smaller vias (e.g., vias having a width that is less than 1 µm) in the lower metal levels often become rounded; however, this rounding effect disappears in larger vias (e.g., vias having a width that is greater than 1 µm) and the vias retain the square shape.

Various different metal materials are known in the art for use in these BEOL interconnect structures including, but not limited to, copper and aluminum. Those skilled in the art will recognize that the deposition techniques employed during formation of such BEOL interconnect structures will vary depending upon the type of metal materials used. For example, the optimal technique currently employed for copper deposition is electroplating, whereas the optimal technique currently employed for aluminum deposition is a conformal deposition process. The different deposition techniques pose different challenges during manufacturing. For example, a metal material, such as aluminum, that is conformally deposited into a rectangular or square shaped via opening may bulge in the corners of that via opening. This bulging of the metal material can be the source of defects (e.g., pin holes) within passivation material that is subsequently deposited onto the metal. Pin holes in the passivation material allow for surface corrosion attacks on the metal to occur, thereby leading to defects that can result in yield loss and reliability issues for critical applications.

More specifically, rectangular or square-shaped via opening(s) can be lithographically patterned and etched in the ILD material of a given BEOL metal level. Then, a thick conformal metal layer (e.g., a thick conformal aluminum or aluminum alloy layer) can be deposited over the ILD material such that each via opening is filled, thereby forming the metal via(s). Next, metal wire(s) can be formed by lithographically patterning and etching that portion of the conformal metal layer remaining on the top surface of the ILD material. One or more passivation layers can be formed over the metal wire(s) and additional ILD material can be deposited on the uppermost passivation layer, thereby completing the BEOL metal level and the metal interconnect structures therein.

Figure 1B:
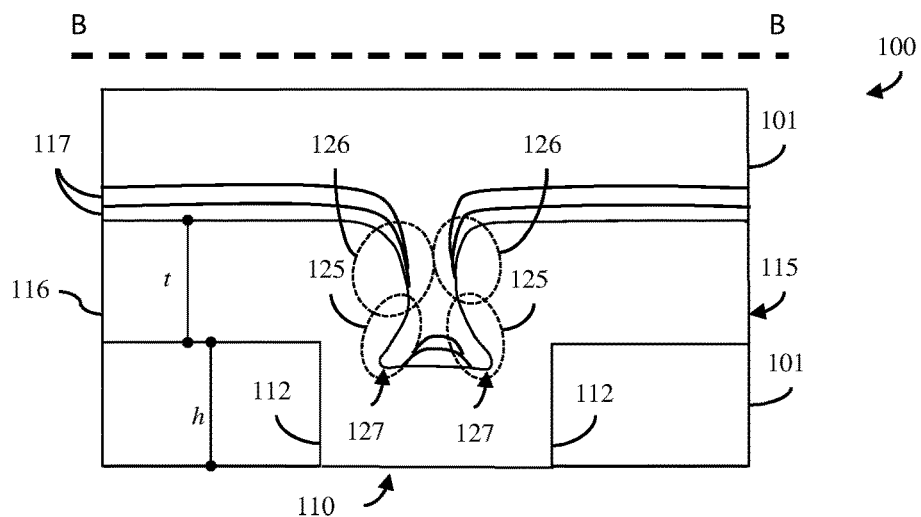
Figure 1C:
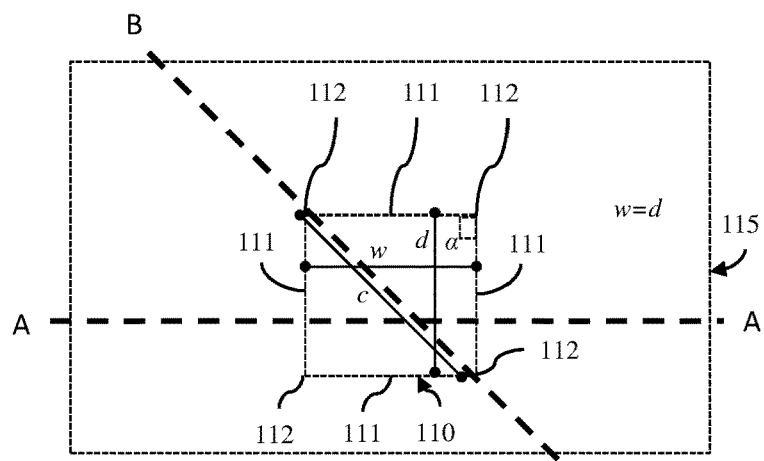

FIGS. 1A and 1B are different vertical cross-section diagrams A-A and B-B, respectively, illustrating an exemplary BEOL metal structure 100 formed using the above-described technique. FIG. 1C is a perspective diagram showing the relative locations of the different vertical cross-sections A-A and B-B. Referring to FIGS. 1A-1C in combination, the BEOL metal structure 100 includes a BEOL metal level and, within the BEOL metal level, a metal wire 115 and a metal via 110. The metal via 110 fills a via opening that extends essentially vertically downward from the bottom of the metal wire 115 through ILD material 101 (e.g., to another metal wire in a lower metal level below (not shown)). The metal wire 115 and metal via 110 include respective portions of a continuous conformal metal layer 116 (e.g., an aluminum or an aluminum alloy layer). One or more conformal passivation layers 117 is/are on the top surface of the conformal metal layer 116. Additional ILD material 101 (e.g., for the next metal level) is on the uppermost passivation layer 117.

In this exemplary BEOL metal structure 100, the via opening has four sides 111, which are all of equal length (i.e., width (w)=depth (d)), and four 90° corners 112, as illustrated in FIG. 1C. That is, the via opening is essentially square in shape when viewed in a horizontal cross-section or top down. As mentioned above, smaller vias (e.g., vias having a width that is less than 1 μm) in the lower metal levels may become rounded during processing; however, larger vias (e.g., vias having a width that is greater than 1 μm) typically retain their square shape. In this exemplary BEOL metal structure 100, the conformal metal layer 116 has a thickness (t) that is approximately equal to or greater than the height (h) of the via opening. In this exemplary BEOL metal structure 100, each conformal passivation layer 117 is relatively thin as compared to the conformal metal layer 116, as illustrated in FIG. 1A. However, with this configuration, conformal deposition of the metal material for the conformal metal layer 116 can result in bulges (i.e., overhangs) 126 of metal material around the upper edges of the via opening primarily at the corners 112 where adjacent sides 111 meet and, as a result, divots 125 in the metal material (i.e., relatively thin portions of the metal material) in the corners below the bulges 126, respectively. Unfortunately, when the passivation layer(s) 117 are conformally deposited (e.g., by chemical vapor deposition (CVD)), full/uniform coverage of exposed surfaces of the conformal metal layer 116 within the divots 125 is difficult and pin hole(s) 127 may exist in the passivation material leaving some of the metal material exposed. If the surface of the conformal metal layer 116 is exposed by pin holes 127 during subsequent processing, surface corrosion can occur. The resulting metal via 110 will be prone to defects caused by surface corrosion and formation of metal vias with such defects can result in yield loss for critical applications.

In view of the foregoing, disclosed herein are embodiments of a back end of the line (BEOL) metal structure. The BEOL metal structure can include a BEOL metal level and, within the BEOL metal level, a metal via with at least eight sides in a dielectric layer and a metal wire thereon. The metal via and the metal wire can include respective portions of the same continuous conformal metal layer. A passivation layer can completely coat the top surface of the metal layer. In some embodiments, this metal via with at least eight sides and the metal wire thereon can be in an upper BEOL metal level and can be made of one type of metal (e.g., aluminum or an aluminum alloy). In some embodiments, the upper BEOL metal level can be above a lower BEOL metal level that similarly includes a metal via and a metal wire thereon, but the metal used can be different (e.g., copper as opposed to aluminum or an aluminum alloy) and/or the shape of the via can be different (e.g., a via with four sides as opposed to a via with eight or more sides). Also disclosed herein are method embodiments for forming the above-described BEOL metal structure.

Specifically, referring to FIGS. 2A-2D and 3A-3D, disclosed herein are embodiments of a BEOL metal structure 200 and 300, respectively. Each embodiment of the BEOL metal structure includes at least one BEOL metal level. For purposes of illustration, two BEOL metal levels are shown including a lower BEOL metal level (Ml) and an upper BEOL metal level (Mu) above the lower metal level. It should, however, be understood that the figures are not intended to be limiting. That is, embodiments of the BEOL metal structure can include one or more BEOL metal levels. Those skilled in the art will recognize that modern IC chips often include five or more BEOL metal levels.

Each BEOL metal level can include a dielectric layer (e.g., a lower dielectric layer for the lower metal level (Ml) and an upper dielectric layer for the upper metal level (Mu)). The dielectric layer can include a single layer or multiple layers of interlayer dielectric material (ILD) 201, 301. This ILD material can be, for example, silicon oxide or any other suitable ILD material (e.g., borophosphosilicate glass (BPSG), tetraethyl orthosilicate (TEOS), fluorinated tetraethyl orthosilicate (FTEOS), etc.).

Each BEOL metal level can further include metal interconnect structures embedded within the ILD material 201, 301. The metal interconnect structures can provide the electrical connections between on-chip devices and from on-chip devices to off-chip components (e.g., through input/output pins). The metal interconnect structures can include metal wires (also referred to herein as metal lines), which are oriented essentially parallel to the wafer surface (i.e., horizontally). The metal interconnect structures can also include metal vias, which are oriented essentially perpendicular to the wafer surface (i.e., vertically), and extend from the bottom of one metal line downward through ILD material to the top of another metal line. For example, see the first metal via 297, 397 and the first metal wire 298, 398 thereon in the lower BEOL metal level (Ml); see also the second metal via 210, 310 and the second metal wire 215, 315 thereon in the upper BEOL metal level (Mu).

More specifically, at least one BEOL metal level (e.g., see the upper BEOL metal level (Mu)) can include a dielectric layer (e.g., one or more layers of ILD material 201, 301). The dielectric layer can have a first surface and a second surface opposite the first surface. The first surface can be the bottom surface of the dielectric layer and the second surface can be the top surface of the dielectric layer or, alternatively, the bottom surface of a wire trench within an upper portion of the dielectric layer (depending upon whether single damascene or, alternatively, dual damascene techniques are employed during processing, see detailed discussion below with regard to the method embodiments). In any case, a metal via 210, 310 can extend essentially vertically through the entire thickness of dielectric layer from the second surface down to the first surface and a metal wire 215, 315 can be on the second surface and electrically connected to the metal via 210, 310.

Figure 2A:
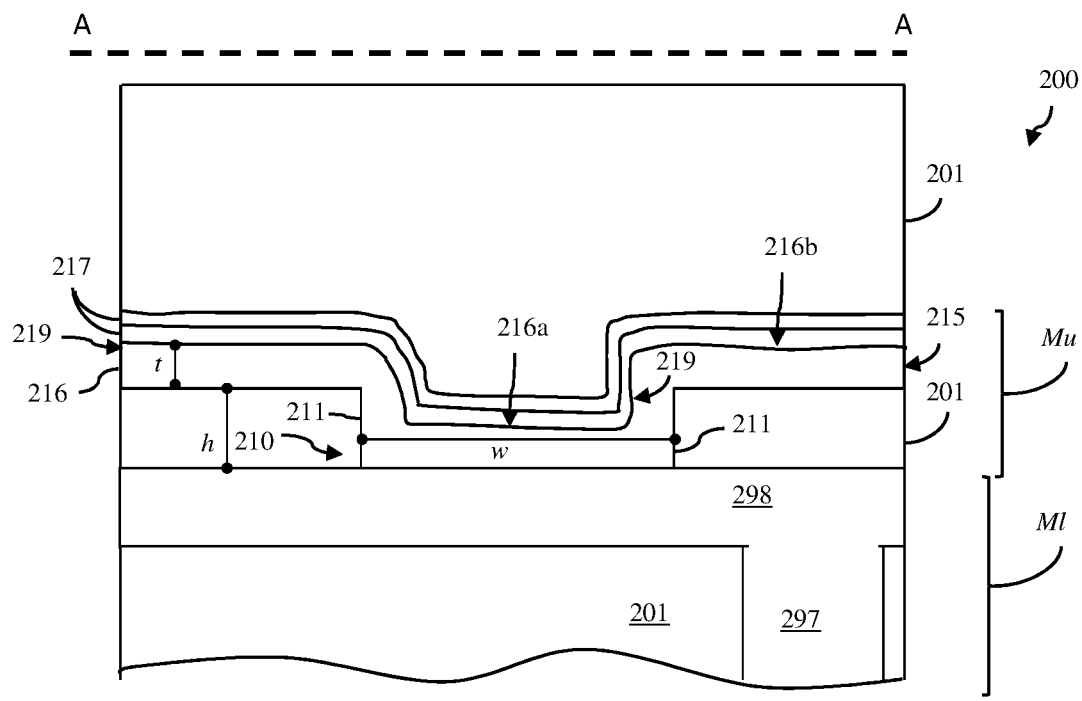
FIGS. 2A and 2B are cross-section diagrams illustrating an embodiment of a BEOL metal structure 200.
Figure 2B:
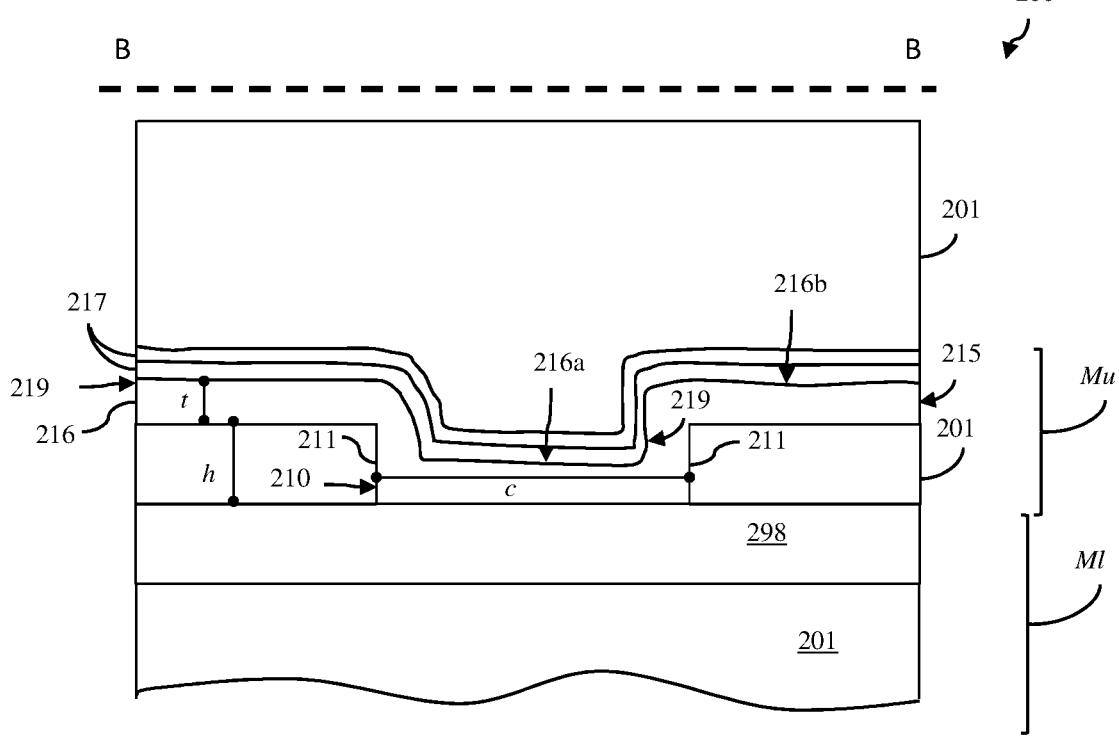
Figure 2C:
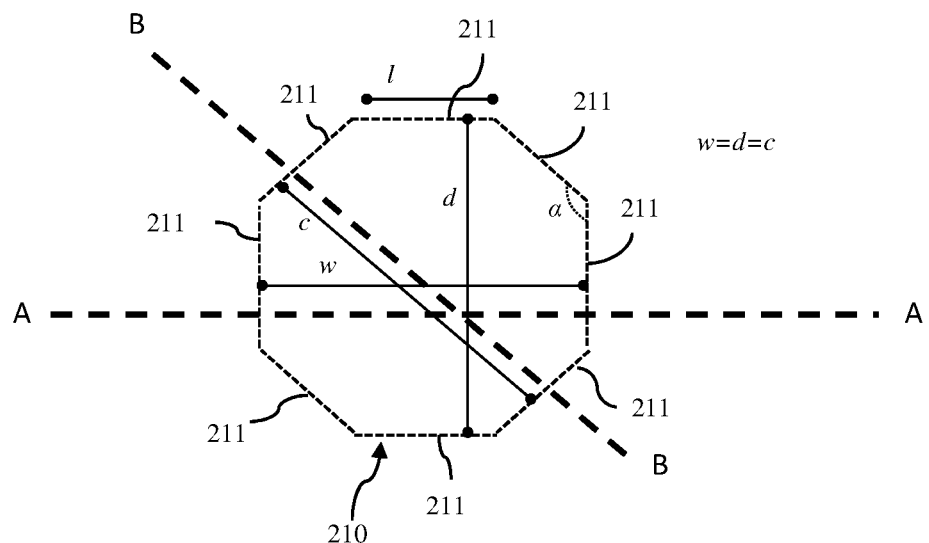
FIG. 2C is a perspective diagram showing an exemplary octagon shaped metal via within the BEOL metal structure of FIGS. 2A and 2B.
Figure 2D:
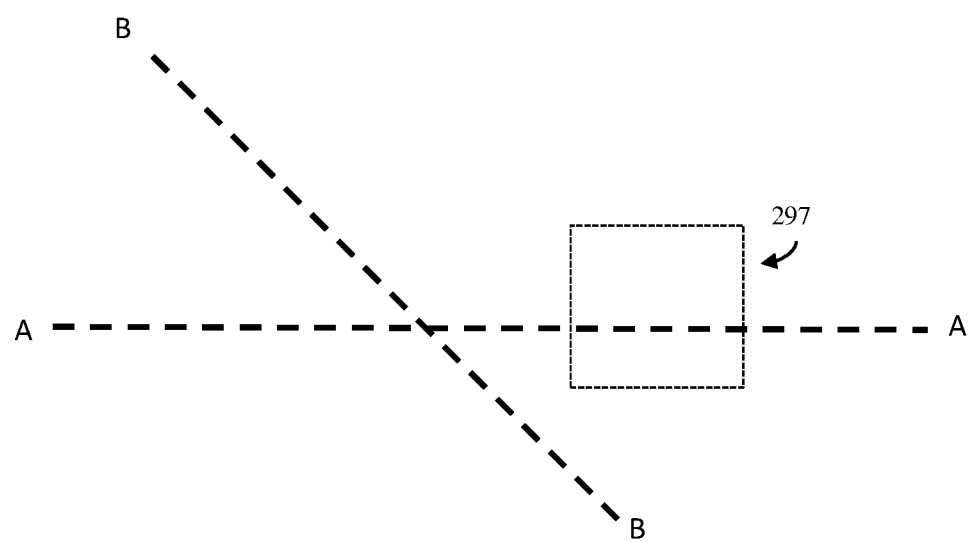
FIG. 2D is a perspective diagram showing an optional square shaped metal via within the BEOL metal structure of FIGS. 2A and 2B.
Figure 3A:
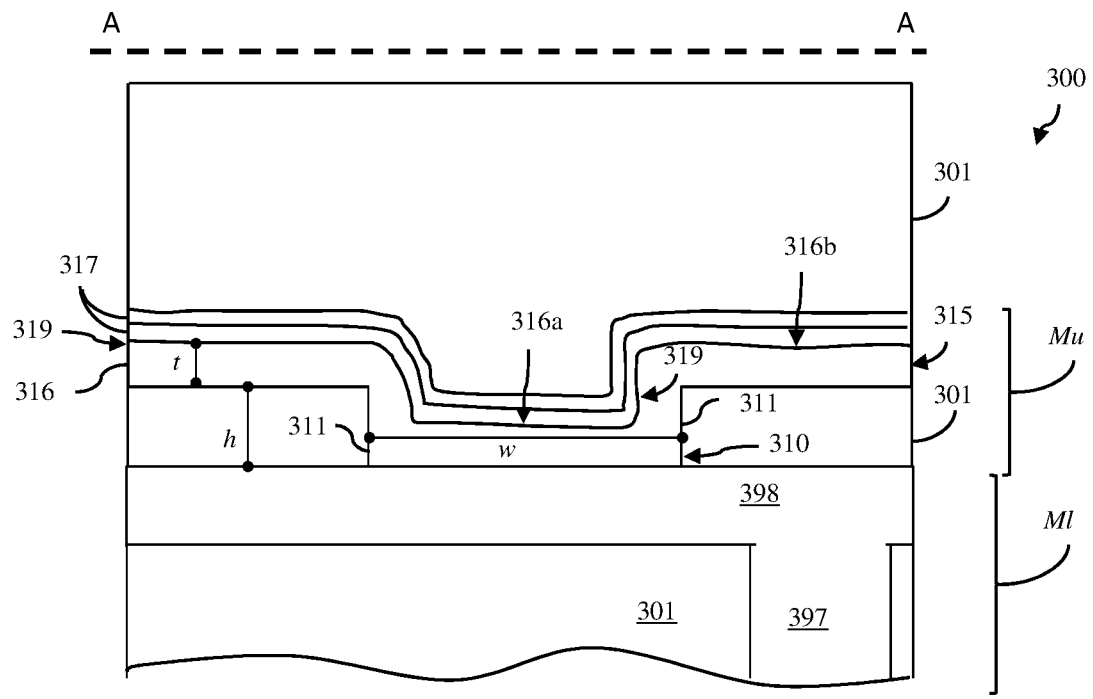
FIGS. 3A and 3B are cross-section diagrams illustrating another embodiment of a BEOL metal structure 300.
Figure 3B:
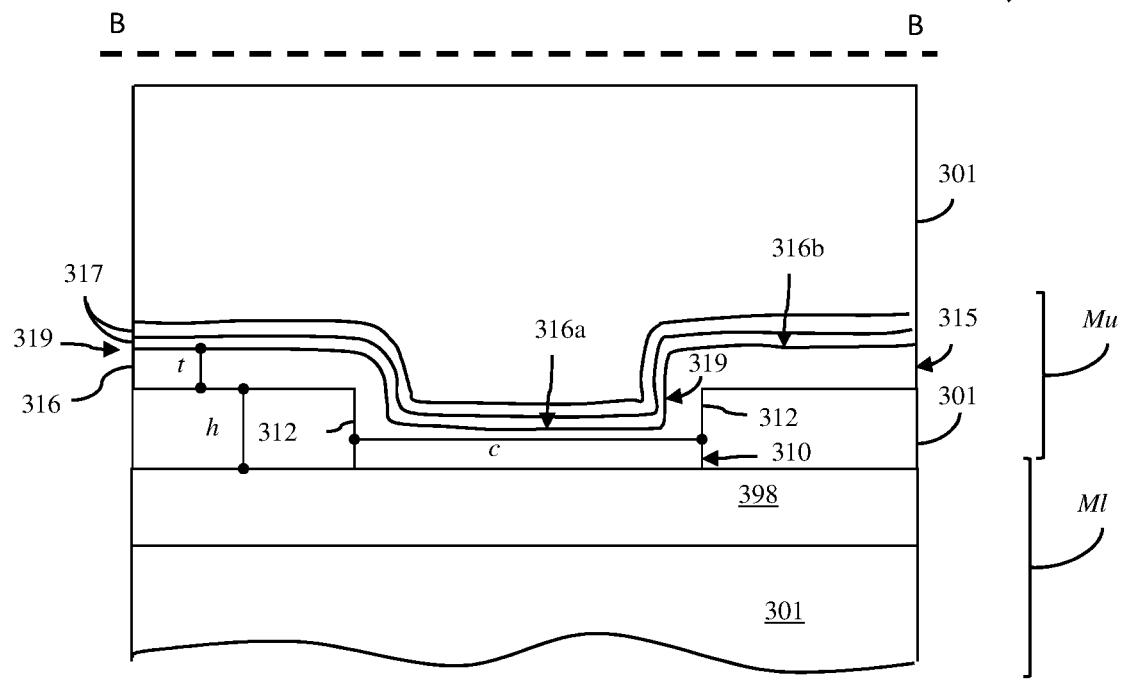
Figure 3C:
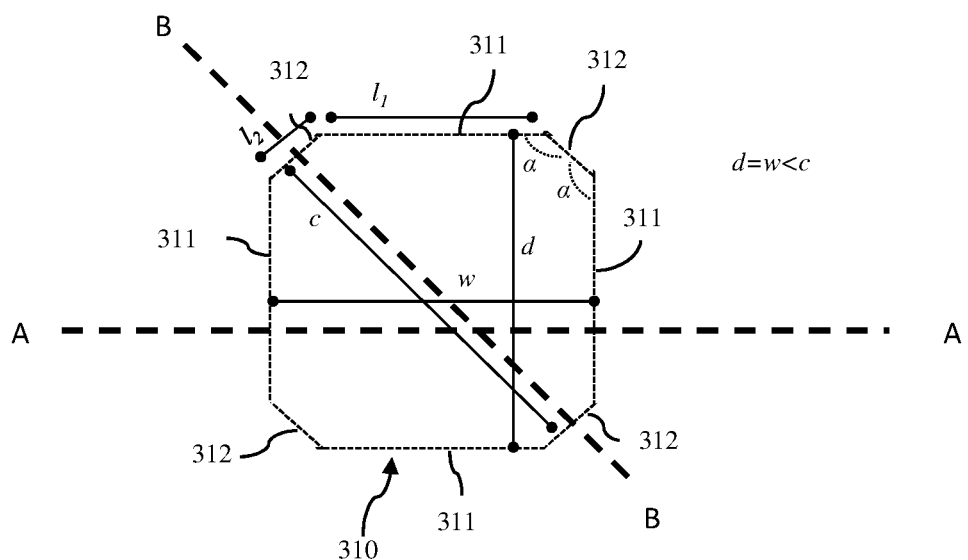
FIG. 3C is a perspective diagram showing another exemplary octagon shaped metal via within the BEOL metal structure of FIGS. 3A and 3B.
Figure 3D:
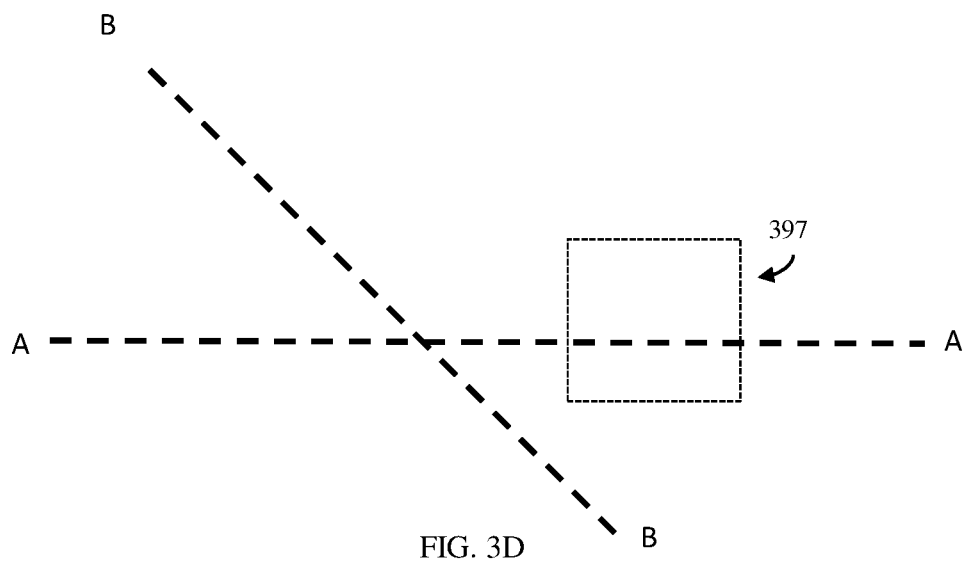
FIG. 3D is a perspective diagram showing an optional square shaped metal via within the BEOL metal structure of FIGS. 3A and 3B.

The metal via 210, 310 can have at least eight sides (also referred to herein as sidewalls), where each interior angle (a) at each junction between adjacent sides is at least 135°. For example, the shape of the metal via 210, 310 when viewed from a horizontal cross-section could be an octagon (as illustrated in FIGS. 2C and 3C-2D), a nonagon, a decagon, etc. and this shape will be defined by the shape of a patterned via opening within which the metal via 210, 310 is formed during processing. It should be understood that for purposes of this disclosure, the width (w), the depth (d) and the dimension (c) of a metal via (or via opening) are all measured parallel to the first and second surfaces of the dielectric layer (i.e., parallel to the bottom of the substrate) with the width (w) being essentially perpendicular to the depth (d). The lengths of the sides of the metal via (or via opening) are also measured parallel to the first and second surfaces of the dielectric layer. Furthermore, the height (h) of a metal via (or via opening) is measured in a direction that is approximately perpendicular (e.g., plus or minus 10 degrees) to the first and second surfaces of the dielectric layer. Furthermore, each side of the via opening (and metal via therein) is an essentially planar (e.g., essentially flat) surface that lies (or "runs" or "extends") in a plane that is approximately perpendicular (e.g., plus or minus 10 degrees) to the first and second surfaces of the dielectric layer through which the metal via extends. In other words, the sides of the metal via (or via opening) extend through the dielectric layer from one surface to the other in an essentially perpendicular direction to the dielectric layer.

Generally, the embodiments of the BEOL metal structure 200 shown in FIGS. 2A-2D and the embodiments of the BEOL metal structure 300 shown in FIGS. 3A-3D both include a metal via with an octagonal shape. They different with respect to the type of octagonal shape, as discussed below.

Specifically, the metal via 210 has a regular octagon shape, as illustrated in FIG. 2C. Thus, the lengths (l) of all sides 211 are equal. Given the equal lengths of the sides, the angle ($\alpha$) at the junction between any two adjacent sides 211 is also equal and, more particularly, 135°. Thus, there are no sharp corners (e.g., no corners that are less than 135°) within the metal via 210. Furthermore, the distance between any two opposing sides 211 is equal such that the width (w), the depth (d) and a dimension (c) (which is in the direction of the cross-section B-B) of the metal via 210 are all equal.

The metal via 310 has an isogonal octagon shape, as illustrated in FIG. 3C. In this case, the metal via 310 has alternating first sides 311 and second sides 312, where the first sides 311 have the same first length ($l_1$) and the second sides 312 have the same second length ($l_2$) that is less than the first length ($l_1$). Such a metal via 310 resembles a square via except that the corners are chamfered (i.e., cropped or beveled). The angle (a) at the junction between any two adjacent sides 311-312 is equal (i.e., 135°). Thus, there are no sharp corners (e.g., corners that are less than 135°) within the metal via 310. Furthermore, the distance between any two opposing first sides 311 is equal and the distance between any two opposing second sides 312 is also be equal. Thus, the width (w) and the depth (d) of the metal via 310 are equal. However, given the different lengths $l_1$ and $l_2$ of the first and second sides, the dimension (c) of the metal via 310 (in the direction of the cross-section B-B) is greater than the width (w) and depth (d).

In the disclosed BEOL metal structures, the width (w) and depth (d) of the metal via 210, 310 can each be at least four times its height (h). For example, the width (w) and depth (d) of the metal via 210, 310 can each be five times its height (h). Thus, the metal via 210, 310 has a relatively low aspect ratio of 1 to at least 4. Furthermore, in those embodiments where the metal via 310 has alternating first sides 311 with a first length ($l_1$) and second sides 312 with a second length ($l_2$) that is less than the first length ($l_1$) (e.g., as shown in FIGS. 3A-3D), the second length ($l_2$) of the second sides 312 of the metal via 310 can be equal to or greater than one-third the height (h) of the metal via 310.

Optionally, the metal via 210, 310 can be tapered from the second surface of the dielectric layer down to the first surface (not shown).

As mentioned above, the metal wire 215, 315 can be on the second surface of the dielectric layer 201, 301 and electrically connected to the metal via 210, 310. As discussed in greater detail below with regard to the method embodiments, one or more of the process steps used to form the metal via 210, 310 and the metal wire 215, 315 can be performed concurrently including, but not limited to, a conformal metal deposition process (e.g., a physical vapor deposition (PVD) process). Thus, the metal via 210, 310 and the metal wire 215, 315 can have a shared metal layer and, more particularly, can include respective portions of a continuous conformal metal layer 216, 316. That is, a first portion 216a, 316a of the metal layer 216, 316 for the metal via 210, 310 can line the via opening and a second portion 216b, 316b of the metal layer 216, 316 for the metal wire 215, 315 can be above the second surface of the dielectric layer.

The metal layer 216, 316 can have a thickness (t), which is essentially uniform and which ranges between ⅓ the height (h) of the metal via 210, 310 and 5 times the height (h) of the metal via 210, 310. For example, in some embodiments, the metal layer 216, 316 can have a thickness (t) ranging from approximately 1 µm to approximately 3 µm. Additionally, in some embodiments, the metal via 210, 310 can have a height (h) ranging from approximately 700 nm to approximately 1600 nm. Thus, it should be understood that, although the thickness (t) of the metal layer 216, 316 is shown in FIGS. 2A-2B and 3A-3B as being less than the height (h) of the metal via 210, 310, the thickness (t) of the metal layer 216, 316 could, alternatively, be greater than the height (h) of the metal via 210, 310. In preferred embodiments, the thickness (t) of the metal layer 216, 316 is at least two-thirds the height of the metal via 210, 310.

The metal layer 216, 316 can be, for example, aluminum or an aluminum alloy. For example, the metal layer can be an aluminum layer, an aluminum copper alloy layer, an aluminum silicon alloy layer, an aluminum silicon copper alloy layer, or any other suitable aluminum alloy layer.

One or more passivation layers 217, 317 can completely coat at least the top surface 219, 319 of the metal layer 216, 316. For purposes of this disclosure, the "top surface" 219, 319 of the metal layer 216, 316 has horizontal portions above the second surface of the dielectric layer and bottom of the via opening and vertical portions connecting them. The passivation layer(s) 217, 317 can also coat sidewalls of the metal wire (not shown, for further details see the discussion of the method below). In any case, the passivation layers 217, 317 can include, for example, a silicon dioxide layer immediately adjacent to the top surface of the metal layer 216, 316 and a silicon nitride layer on the silicon dioxide layer. Although two passivation layers are shown in the drawings for the BEOL metal structures 200, 300, it should be understood that the figures are not intended to be limiting. Alternatively, the BEOL metal structures 200, 300 could include a single passivation layer or three or more passivation layers.

It should be noted that, given the dimensions of the metal via 210, 310 (as defined by the via opening with eight or more sides within which the metal via is formed during processing and including the low aspect ratio, the avoidance of sharp corners, and the lengths of the sides relative to the height), given the thickness of the metal layer 216, 316 relative to the height of that via opening, and further given the metal layer deposition technique employed during processing (e.g., PVD), the metal layer 216, 316 in the BEOL metal structure 200, 300 is devoid of significant bulges (i.e., overhangs) around the upper edges of the metal via and, thus, is devoid of any divots (i.e., thin portions that are overshadowed by bulging or overhanging metal material) and, as a result, the passivation layers 217, 317 are deposited such that they completely cover the top surface of the metal layer 216, 316 and the metal layer 216, 316 is protected against surface corrosion.

As mentioned above, optionally, the lower BEOL metal level (Ml) can include a first metal via 297, 397 and a first metal wire 298, 398 thereon and the upper BEOL metal level (Mu) can be above the lower BEOL metal level (Ml) can include a second metal via 210, 310 (which has at least eight sides, where each interior angle at each junction between adjacent sides is at least 135°) and a second metal wire 215, 315 thereon. For example, the second metal via 210, 310 can extend essentially vertically between and can electrically connect the second metal wire 215, 315 and the first metal wire 298, 398, as illustrated.

Optionally, the first metal via 297, 397 and first metal wire 298, 398 can be configured essentially the same as the second metal via 210, 310 and second metal wire 215, 315, respectively.

Alternatively, the first metal via 297, 397 and first metal wire 298, 398 can be configured differently than the second metal via 210, 310 and second metal wire 215, 315, respectively. For example, the first metal via 297, 397 and first metal wire 298, 398 can be made of a first metal material (e.g., copper) and the second metal via 210, 310 and second metal wire 215, 315 can be made of a second metal material that is different from the first metal material (e.g., aluminum or an aluminum alloy, such as an aluminum copper alloy, an aluminum silicon alloy or an aluminum silicon copper alloy). Additionally or alternatively, the first metal via 297, 397 may have a first shape and the second metal via 210, 310 may have a second shape, which is different from the first shape. For example, the first shape of the first metal via 297, 397 may have four sides such that it has a rectangular or square shape (e.g., see the horizontal cross-sections shown in FIGS. 2D and 3D). Alternatively, the first shape of the first metal via 297, 397 may have four sides with rounded corners, may be round, may be oval, etc. (not shown). The second shape of the second metal via 210, 310 can, as discussed above, have at least eight sides, where each interior angle (a) at each junction between adjacent sides is at least 135°. For example, as illustrated, the second shape can be an octagon shape.

It should be noted that BEOL metal structure 200, 300 can further include additional layers, which are not shown in the figures in order to avoid clutter and to allow the reader to focus on the salient aspects of the disclosed structure embodiments. The additional layers can include, but are not limited to, diffusion barrier and/or adhesion layers that physically separate the metal vias and metal wires from adjacent dielectric surfaces. For example, the diffusion barrier and/or adhesion layers can line the via openings and cover the top surface of the dielectric layers containing the via openings. For aluminum or aluminum alloy metal vias and metal wires, the diffusion barrier and adhesion layers can include, for example, thin layers of titanium and titanium nitride or any other suitable diffusion barrier and adhesion layers. For copper metal vias and metal wires, the diffusion barrier and adhesion layers can include, for example, thin layers of tantalum nitride and tantalum or any other suitable diffusion barrier and adhesion layers.

Figure 4:
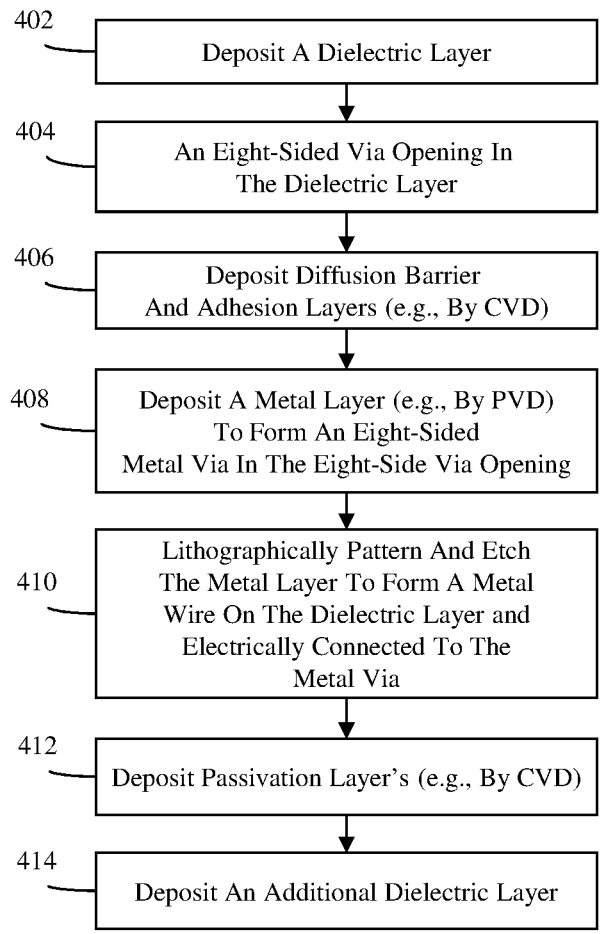
FIG. 4 is a flow diagram illustrating method embodiments for forming BEOL metal structures.

Referring to the flow diagram of FIG. 4, disclosed herein are method embodiments for forming BEOL metal structures, such as the BEOL metal structure 200 of FIGS. 2A-2D or 300 of FIGS. 3A-3D.

Figure 5:
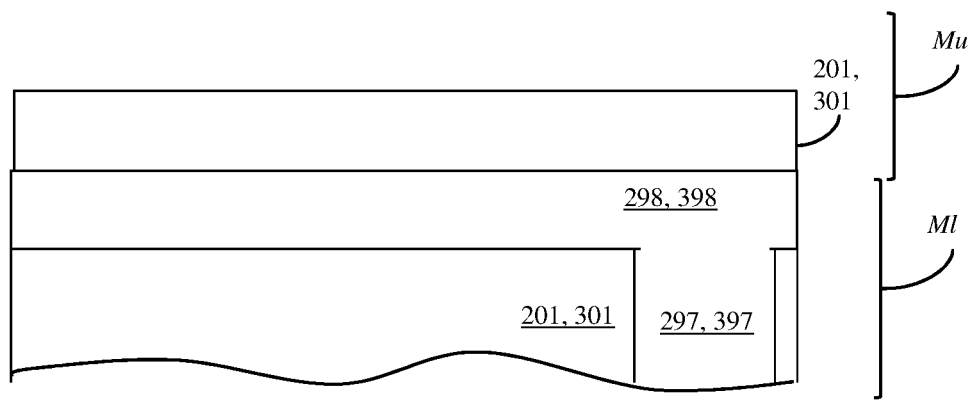
FIG. 5 is a cross-section diagram of a partially completed BEOL metal structure formed according to the flow diagram of FIG. 4.

The method embodiments can include forming a BEOL metal level (e.g., an upper BEOL metal level (Mu)). This BEOL metal level can be formed, for example, over a previously formed lower BEOL metal level (Ml). To form the BEOL metal level, a dielectric layer (e.g., a single layer or multiple layers of interlayer dielectric (ILD) material 201, 301) can be formed (e.g., on the lower BEOL metal level (Ml)) (see FIG. 5 and process step 402 of FIG. 4). The dielectric layer can have a first surface adjacent to the lower BEOL metal level and a second surface opposite the first surface.

Figure 6A:
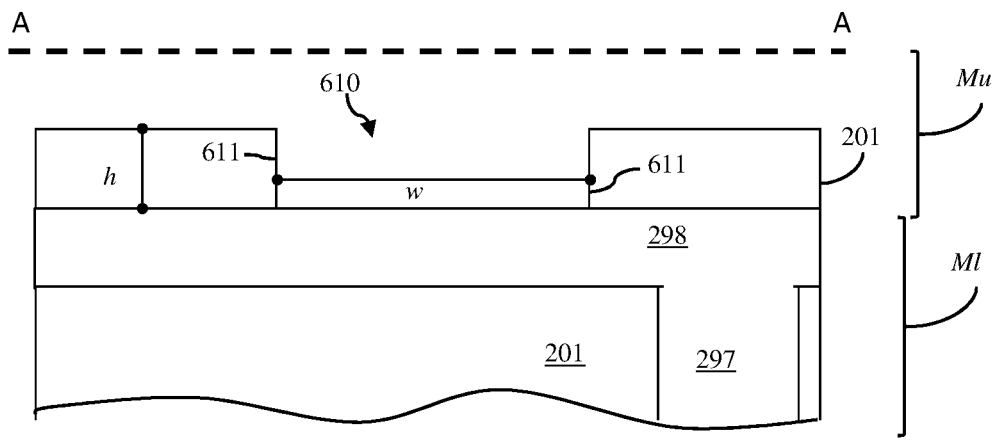
FIGS. 6A and 6B are cross-section diagrams illustrating a partially completed BEOL structure formed according to the flow diagram of FIG. 4 when forming the structure shown in FIGS. 2A-2C and FIG. 6C is a perspective diagram showing the relative locations of the different vertical cross-sections A-A and B-B and the shape of the via opening therein.
Figure 6B:
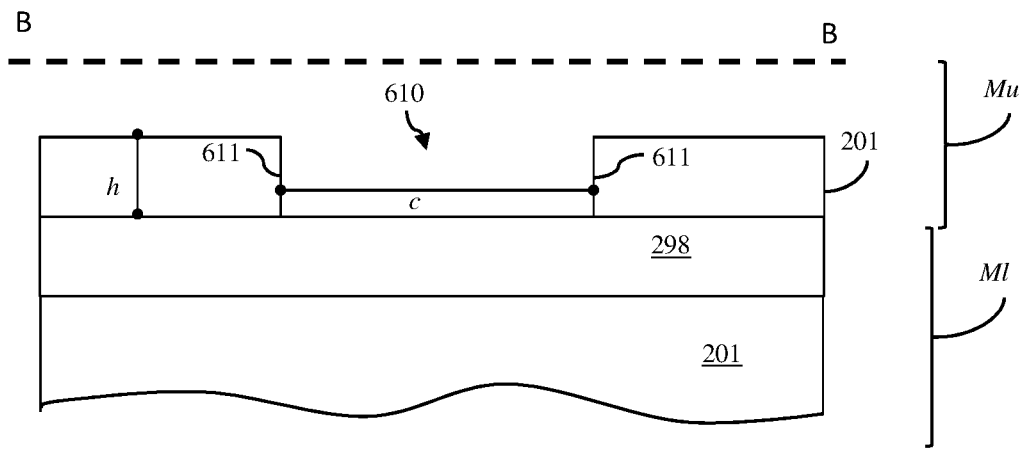

Single damascene processing (or, alternatively, dual damascene processing) can be performed in order to form a metal via 210, 310 in the dielectric layer and a metal wire 215, 315 thereon. For purposes of illustration, the method embodiments are described herein and illustrated in the drawings with respect to single damascene processing. Specifically, a via opening 610, 710 can be patterned (e.g., lithographically or otherwise) and etched into the dielectric layer such that it extends essentially vertically from the second surface down to the first surface (see FIGS. 6A-6C or, alternatively, FIGS. 7A-7C and process step 404).

In the disclosed method embodiments, the via opening 610 can be patterned and etched at process step 404 so as to have a shape with at least eight sides, where each interior angle (a) at each junction between adjacent sides is at least 135° (e.g., an octagonal shape (as shown), a nonagon shape, a decagon shape, etc.). It should be understood that FIGS. 7A-7C differ from FIGS. 6A-6C only with respect to the different octagonal shapes of the via openings 610, 710.

Figure 6C:
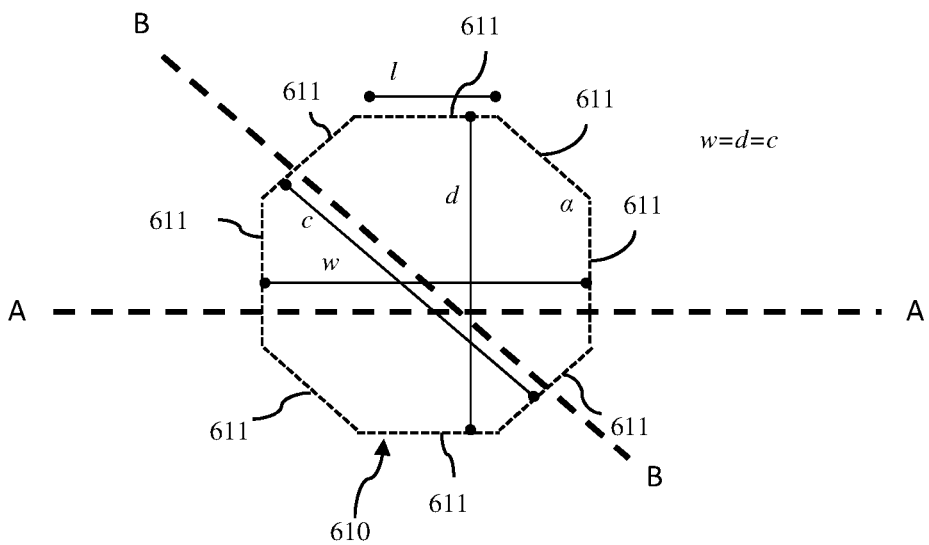
Figure 7A:
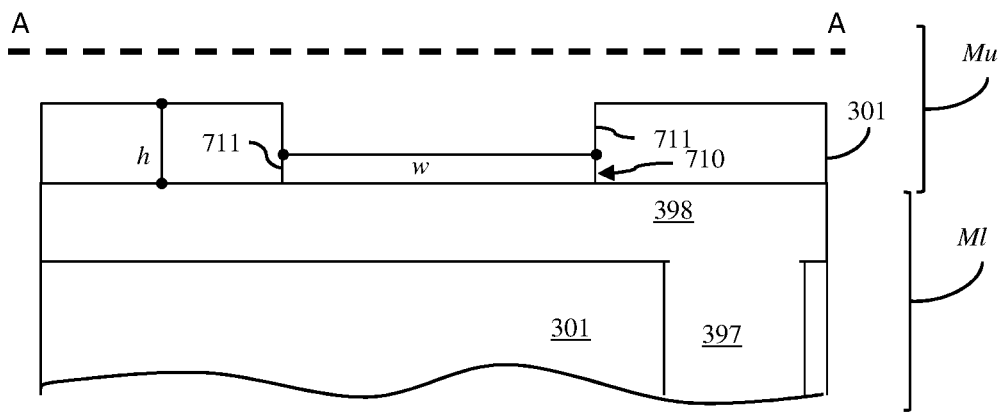
FIGS. 7A and 7B are cross-section diagrams illustrating a partially completed BEOL structure formed according to the flow diagram of FIG. 4 when forming the structure shown in FIGS. 3A-3C and FIG. 7C is a perspective diagram showing the relative locations of the different vertical cross-sections A-A and B-B and the shape of the via opening therein.
Figure 7B:
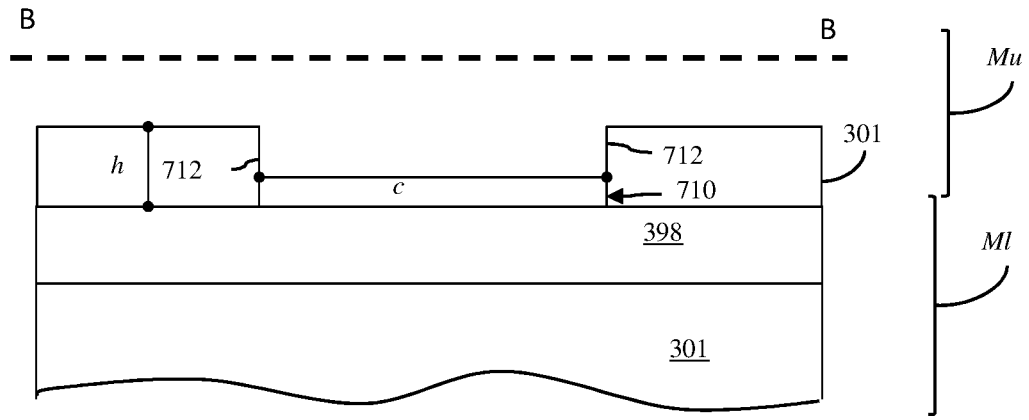

For example, the via opening 610 can be patterned and etched at process step 404 so as to have a regular octagon shape, as illustrated in FIG. 6C. In this case, the lengths (1) of all sides 611 of the via opening 610 are equal. Given the equal lengths of the sides 611, the angle (a) at the junction between any two adjacent sides 611 are also equal and, more particularly, are 135°. Thus, there are no sharp corners (e.g., no corners that are less than 135°) within the via opening. Furthermore, the distance between any two opposing sides 611 are equal such that the width (w), the depth (d) and a dimension (c) (which is in the direction of the cross-section B-B) of the via opening 610 are all equal.

Figure 7C:
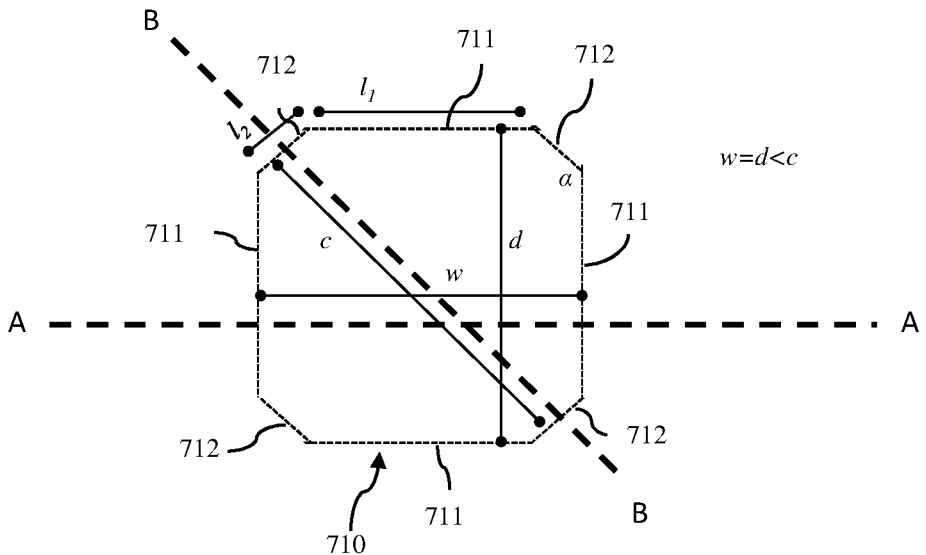

Alternatively, the via opening 710 can be patterned and etched at process step 404 so as to have an isogonal octagon shape, as illustrated in FIG. 7C. That is, the via opening 710 has alternating first sides 711 and second sides 712, where the first sides 711 have the same first length ($l_1$) and the second sides 712 have the same second length ($l_2$) that is less than the first length (h). Such a via opening 710 resembles a square via opening except that the corners are chamfered (i.e., cropped or beveled). The angle (a) at the junction between any two adjacent sides 711-712 is equal (i.e., 135°). Thus, there are no sharp corners (e.g., corners that are less than 135°) within the via opening 710. Furthermore, the distance between any two opposing first sides 711 is equal and the distance between any two opposing second sides 712 is also equal. Thus, the width (w) and the depth (d) of the via opening 710 are equal. However, given the different lengths $l_1$ and $l_2$ of the first and second sides, the dimension (c) of the via opening 710 (in the direction of the cross-section B-B) is greater than the width (w) and depth (d).

In any case, the via opening 610, 710 can be patterned and etched at process step 404 such that the width (w) and depth (d) of the via opening 610, 710 are each at least four times its height (h). For example, in some embodiments, the via opening 610, 710 can be patterned and etched so that the width (w) and depth (d) are each five times the height (h). Thus, the via opening 610, 710 has a relatively low aspect ratio of 1 to at least 4. Furthermore, in those embodiments where the via opening 710 has been patterned and etched so as to have alternating first sides 711 with a first length ($l_1$) and second sides 712 with a second length ($l_2$) that is less than the first length ($l_1$) (e.g., as shown in FIGS. 3A-3D), the second length ($l_2$) of the second sides 712 of the via opening 710 can be equal to or greater than one-third the height (h) of the via opening 710.

Optionally, the via opening 610, 710 can be etched such that it is tapered from the second surface of the dielectric layer down to the first surface (not shown).

It should be understood that for purposes of this disclosure, the width (w), the depth (d) and the dimension (c) of the via opening 610, 710 are all measured parallel to the first and second surfaces of the dielectric layer (i.e., parallel to the bottom of the substrate) with the width (w) being essentially perpendicular to the depth (d). The lengths of the sides of the via opening are also measured parallel to the first and second surfaces of the dielectric layer. Furthermore, the height (h) of the via opening is measured in a direction that is approximately perpendicular (e.g., plus or minus 10 degrees) to the first and second surfaces of the dielectric layer. Furthermore, each side of the via opening can be an essentially planar (e.g., essentially flat) surface that lies (or "runs" or "extends") in a plane that is approximately perpendicular (e.g., plus or minus 10 degrees) to the first and second surfaces of the dielectric layer through which the metal via extends. In other words, the sides of the metal via (or via opening) extend through the dielectric layer from one surface to the other in a perpendicular direction to the dielectric layer.

Furthermore, after the via opening 610, 710 is formed, diffusion barrier and/or adhesion layers (not shown) can optionally be deposited onto the second surface of the dielectric layer and further lining the via opening (see process step 406). Those skilled in the art will recognize that the optimal diffusion barrier and/or adhesion layers will vary depending upon the metal material that will subsequently be deposited at process step 408. For example, for aluminum or aluminum alloy metal vias and metal wires, the diffusion barrier and adhesion layers can include, for example, thin layers of titanium and titanium nitride or any other suitable diffusion barrier and adhesion layers.

Figure 8A:
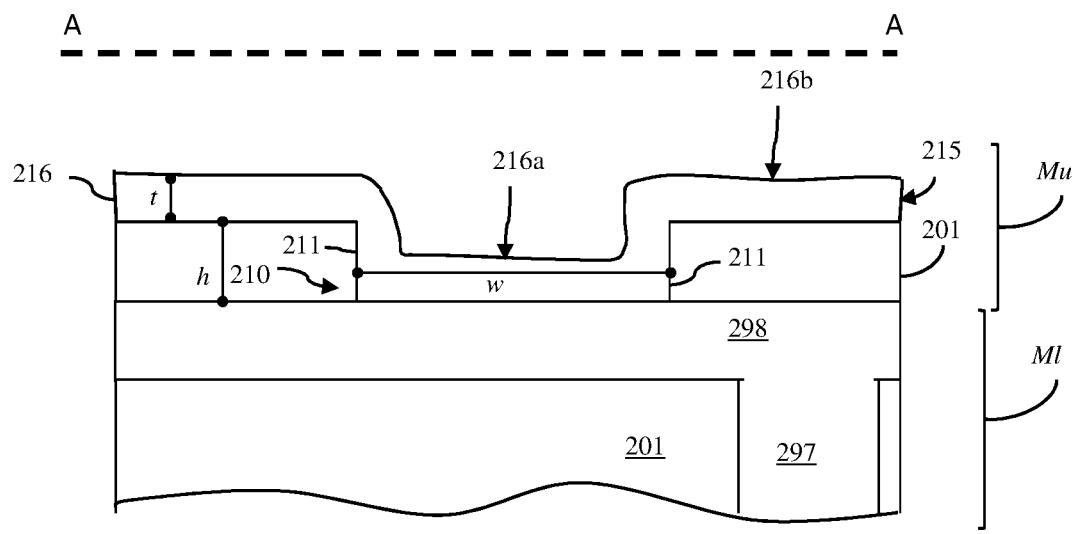
FIGS. 8A and 8B are cross-section diagrams illustrating a partially completed BEOL structure formed according to the flow diagram of FIG. 4 when forming the structure shown in FIGS. 2A-2C.
Figure 8B:
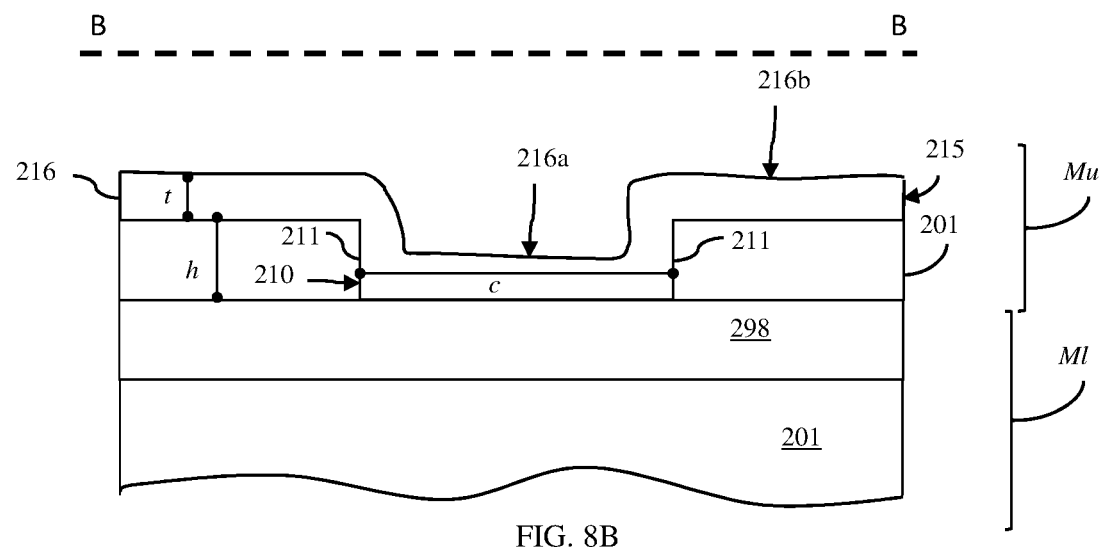
Figure 9A:
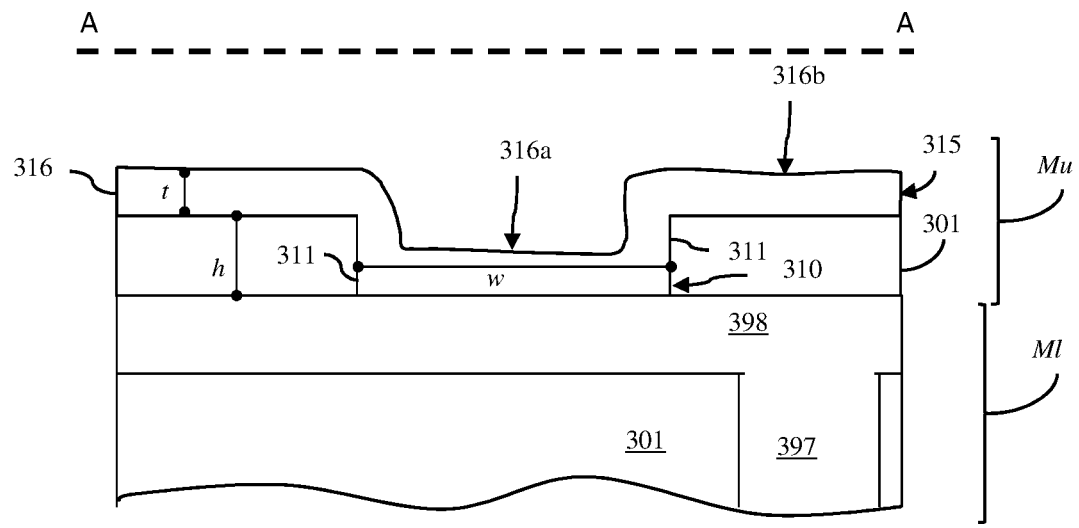
FIGS. 9A and 9B are cross-section diagrams illustrating a partially completed BEOL structure formed according to the flow diagram of FIG. 4 when forming the structure shown in FIGS. 3A-3C.
Figure 9B:
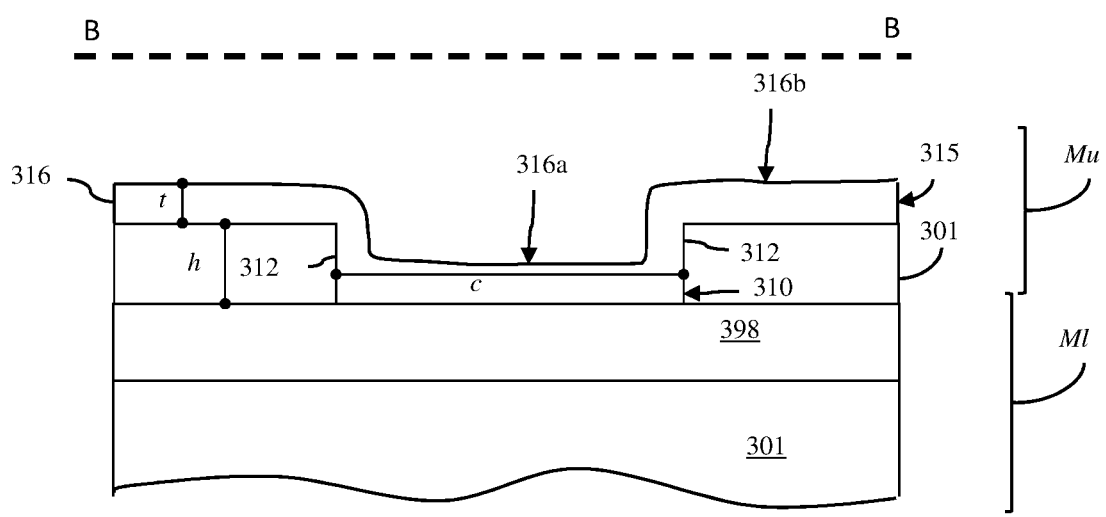

Next, a conformal metal deposition process can be performed so as to deposit a conformal metal layer 216, 316 on the diffusion barrier and/adhesion layers (if present) adjacent to the second surface of the dielectric layer and further lining the via opening 610, 710 (see FIGS. 8A-8B or, alternatively, FIGS. 9A-9B and process step 408). The process of lining the eight-sided via opening 610, 710 with a portion of the metal layer 216, 316 effectively forms an eight-sided metal via 210, 310. It should be understood that FIGS. 9A-9B differ from FIGS. 8A-8B only with respect to the different octagonal shapes of the via openings 610, 710. In any case, the conformal metal layer 216, 316 can be deposited at process step 408 such that it has a thickness (t) that is ⅓ to five times the height (h) of the via opening 610, 710 and, preferably, at least ⅔ or more times the height (h) of the via opening 610, 710. For example, in some embodiments, the ILD material 201, 301 can have a thickness (t) that ranges from approximately 700 nm to approximately 1600 nm such that the via opening etched there through at process 404 has a height (h) ranging from approximately 700 nm to approximately 1600 nm. Additionally, in some embodiments, the metal layer 216, 316 can be deposited at process step 408 so as to have a thickness (t) ranging from approximately 1 μm to approximately 3 μm. Thus, it should be understood that, although the thickness (t) of the metal layer 216, 316 is shown in FIGS. 8A-8B and 9A-9B as being less than the height (h) of the metal via 210, 310, the thickness (t) of the metal layer 216, 316 could, alternatively, be greater than the height (h) of the metal via 210, 310.

The conformal metal layer 216, 316 can be deposited at process step 408 by, for example, physical vapor deposition (PVD). The conformal metal layer 216, 316 that is deposited at process step 408 can be an aluminum layer or, alternatively, an aluminum alloy layer (e.g., an aluminum copper alloy layer, an aluminum silicon alloy layer or an aluminum silicon copper alloy layer). It should be noted that, given the dimensions of the eight-sided via opening 610, 710 (including the low aspect ratio, the avoidance of sharp corners, and the lengths of the sides relative to the height), given the thickness of the metal layer 216, 316 relative to the height (h) of the via opening 610, 710, and further given the metal layer deposition technique employed during processing (e.g., PVD), the metal layer 216, 316 in the partially completed structure following process step 408 will be devoid of significant bulges (i.e., overhangs) extending around the upper edges of the via opening and, thus, devoid of divots that are overshadowed by bulging metal material.

Following metal layer deposition at process step 408, the portion of the metal layer 216, 316 on the second surface of the dielectric layer can be patterned (e.g., lithographically or otherwise) and etched to form a metal wire 215, 315 that is electrically connected to the metal via 210, 310 (see process step 410). Thus, the metal via 210, 310 and the metal wire 215, 315 include respective portions of a continuous conformal metal layer 216, 316.

Those skilled in the art will recognize that, alternatively, dual damascene processing can be performed. In this case, both a wire trench and a via opening can be lithographically patterned and etched into the dielectric layer. The dimensions of the via opening can be essentially the same as those described above and illustrated in the drawings. In this case, metal layer deposition concurrently forms a metal via in the via opening and a metal wire in the wire trench and a chemical mechanical polishing (i.e., CMP) process can be performed in order to remove any metal material that remains outside the wire trench and via opening. Thus, the lithographic patterning and etch processes performed at process step.

Next, one or more passivation layers 217, 317 can be conformally deposited so as to coat exposed surfaces of the metal layer 216, 316 (see process step 412 and FIGS. 2A-2D or 3A-3D). The passivation layers 217, 317 can be deposited one after the other (e.g., by CVD) and can include, for example, a silicon dioxide layer immediately adjacent to the exposed surfaces (including the exposed top surface including exposed horizontal surfaces as well as any exposed essentially vertical surfaces created conformal deposition into the via opening and, if applicable, any exposed sidewalls of the metal layer 216, 316 following wire patterning) and a silicon nitride layer on the silicon dioxide layer. Although two passivation layers are shown in the drawings as being deposited at process step 412, it should be understood that the figures are not intended to be limiting. Alternatively, a single passivation layer or three or more passivation layers could be deposited onto the metal layer at process step 412. It should be noted that because the metal layer 216, 316 is devoid of bulges (i.e., overhangs) around the upper edges of the octagon-shaped via opening, the passivation layers 217, 317 can be deposited such that they completely cover the exposed surfaces of the metal layer 216, 316. In other words, the passivation layer(s) can be deposited without the formation of pinholes therein that would leave surfaces of the metal exposed. Thus, the method forms a BEOL metal structure 200, 300 where the metal layer 216, 316 of the metal via 210, 310 and metal wire 215, 315 thereon are fully protected against surface corrosion.

Following formation of the passivation layer(s) 217, 317, an additional dielectric layer (e.g., a single layer or multiple layers of ILD material 201, 301) can be deposited onto the uppermost passivation layer 217, 317 (see process step 414 and FIGS. 2A-2D or 3A-3D).

As mentioned above, the BEOL metal level with the eight or more sided metal via 210, 310 and metal wire 215, 315 thereon can be an upper BEOL metal level (Mu) that is formed, for example, over a previously formed lower BEOL metal level (Ml). Thus, the method can also include, before forming the upper BEOL metal level (Mu), forming the lower BEOL metal level (Ml). Forming the lower BEOL metal level (Ml) can include forming a metal via 297, 397 and a metal wire 298, 398 thereon. The metal via 297, 397 and metal wire 298, 398 of the lower BEOL metal level can be formed in the same manner as described above with respect to the metal via 210, 310 and metal wire 215, 315, respectively, of the upper BEOL metal level. Alternatively, the metal via 297, 397 and metal wire 298, 398 can be formed differently. That is, the metal via 297, 397 and metal wire 298, 398 of the lower BEOL metal level can be formed using a different metal than that used in the upper BEOL metal level (e.g., copper as opposed to aluminum or an aluminum alloy). Additionally or alternatively, the metal via 297, 397 and metal wire 298, 398 of the lower BEOL metal level can be made using a different metal deposition technique than that used in the upper BEOL metal level (e.g., electroplating as opposed to PVD). Additionally or alternatively, the metal via 297, 397 can be formed so as to have a different shape than the metal via 210, 310. For example, the first shape of the first metal via 297, 397 may have four sides such that it has a rectangular or square shape (e.g., see the horizontal cross-sections shown in FIGS. 2D and 3D). Alternatively, the first shape of the first metal via 297, 397 may have four sides with rounded corners, may be round, may be oval, etc. (not shown).

Figure 10:
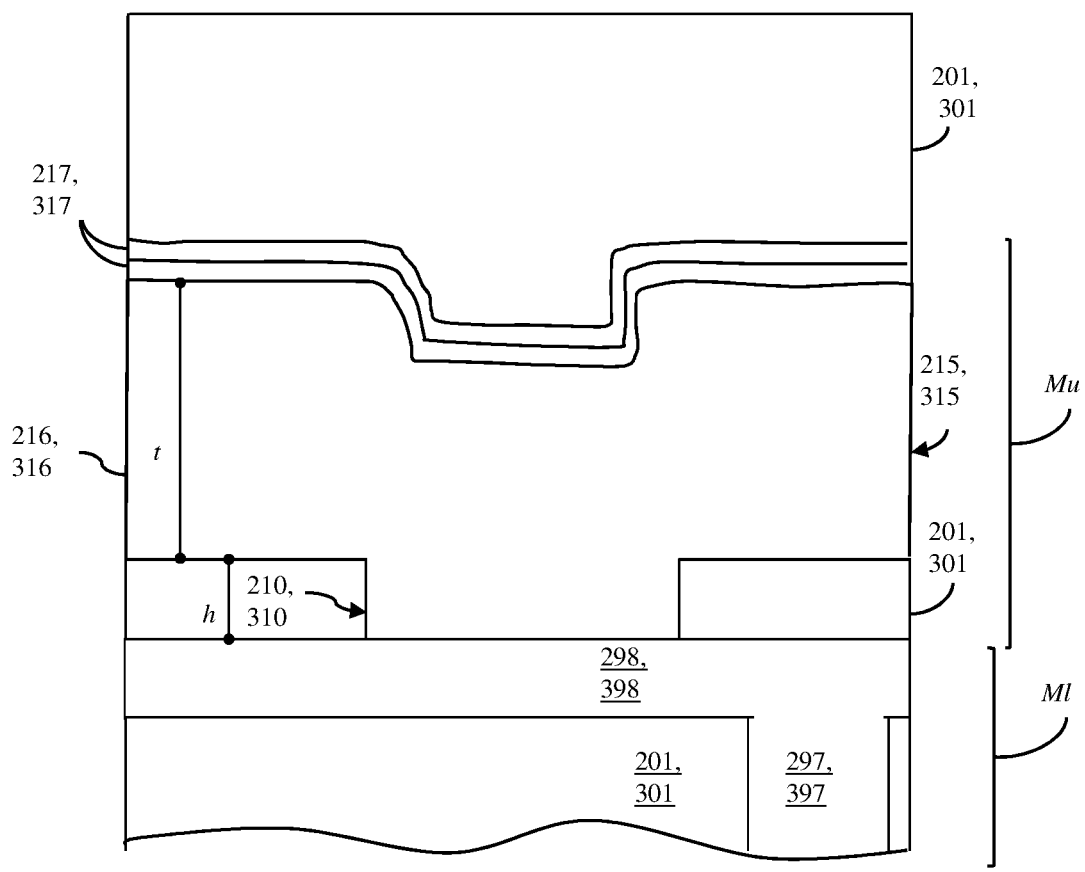
FIG. 10 is a cross-section diagram illustrating the BEOL metal structure 200 (or 300) wherein the conformal metal layer is thicker than the height of the metal layer.

As mentioned above, the metal layer 216, 316 in the disclosed structure and method is shown as having a thickness (t) that is less than the height (h) of the metal via 210, 310; however, it is anticipated that the thickness (t) can range between ⅓ and 5 times the height (h) of the metal via 210, 310. FIG. 10 is a cross-section diagram illustrating the BEOL metal structure 200 (or, alternatively, 300) if/when when a relatively thick metal layer 216, 316 is used. As illustrated, even with the relatively thick metal layer 216, 316, given the dimensions of the eight-sided via opening (including the low aspect ratio, the avoidance of sharp corners, and the lengths of the sides relative to the height), given the thickness of the metal layer 216, 316 relative to the height (h) of the via opening, and further given the metal layer deposition technique employed during processing the upper edges of the via opening and, thus, devoid of divots (i.e., thin portions that are overshadowed by bulging or overhanging metal material) and, as a result, the passivation layers 217, 317 are deposited such that they completely cover the top surface of the metal layer 216, 316 and the metal layer 216, 316 is protected against surface corrosion.

Figure 11A:
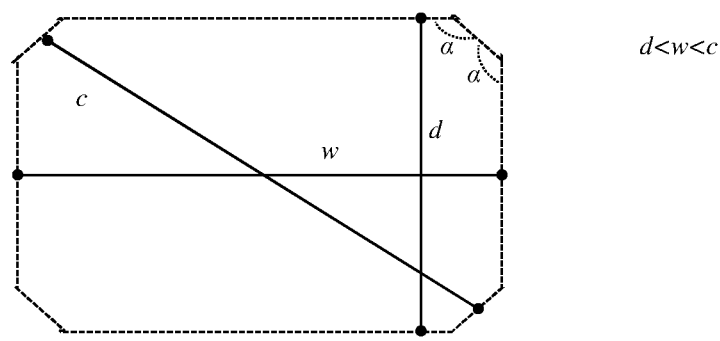
FIGS. 11A-11C are horizontal cross-sections of alternative via shapes that could be incorporated into the disclosed BEOL metal structure and method embodiments.
Figure 11B:
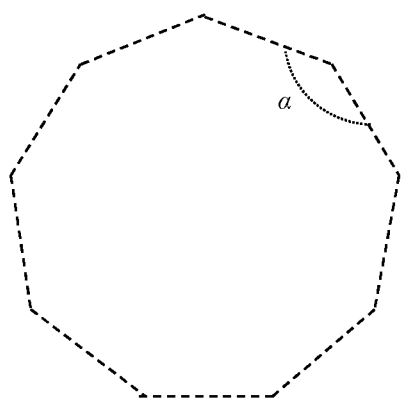
Figure 11C:
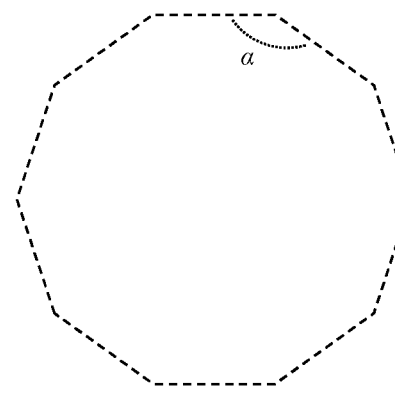

It should be noted that in the disclosed BEOL metal structure and method embodiments, which are described above and illustrated in drawings, the via opening is patterned and etched so as to have an octagon shape (when viewed in horizontal cross-section) such that the resulting metal via 210, 310, which is formed in the via opening, has the same octagon shape. However, as mentioned above, in the disclosed BEOL metal structure and method embodiments, the via opening (and, thereby the metal via) could have any suitable shape that has at least eight sides, where the interior angle ($\alpha$) at each junction between adjacent sides is at least 135°. Thus, for example, other BEOL metal structure and method embodiments could include a via opening (and thereby a metal via) with an octagon shape (i.e., an eight-sided shape) where the width and depth are different such that a horizontal cross-section of the via opening resembles an elongated rectangle with chamfered corners (see FIG. 11A). Other BEOL metal structure and method embodiments could include a via opening (and thereby a metal via) with more than eight sides. For example, the via opening (and thereby the metal via) could have a nonagon shape, where each interior angle ($\alpha$) at each junction between adjacent sides is 140°, as shown in FIG. 11B; the via opening (and thereby the metal via) could have a decagon shape, where each interior angle ($\alpha$) at each junction between adjacent sides is is 144°, as shown in FIG. 11C; etc.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a dielectric layer having a first surface and as second surface opposite the first surface;
a metal via that extends through the dielectric layer and has a shape with at least eight sides, wherein within the shape each interior angle at a junction between adjacent sides is at least 135°;
a metal wire on the dielectric layer and electrically connected to the metal via, wherein the metal wire and the metal via comprise respective portions of a continuous metal layer above the dielectric layer and lining a via opening in the dielectric layer; and
a passivation layer coating a top surface of the continuous metal layer, wherein the passivation layer is above the second surface of the dielectric layer and extends into the via opening below the second surface of the dielectric layer wherein the continuous metal layer is thinner than the dielectric layer, and wherein the passivation layer is thinner than the continuous metal layer.

2. The structure of claim 1,
wherein the continuous metal layer is devoid of bulges around edges of the via opening at the second surface of the dielectric layer such that the at least one passivation layer completely coats the top surface of the continuous metal layer both above the dielectric layer and within the via opening.

3. The structure of claim 1, wherein all of the at least eight sides of the metal via have equal lengths.

4. The structure of claim 1, wherein the at least eight sides comprise alternating first sides and second sides, and wherein the first sides have a first length and the second sides have a second length that is less than the first length.

5. The structure of claim 4, wherein the second length is at least one-third a height of the metal via.

6. The structure of claim 1, wherein the metal via has an aspect ratio of one to at least four.

7. The structure of claim 1,
wherein the dielectric layer comprises interlayer dielectric material comprising any of borophosphosilicate glass, tetraethyl orthosilicate, and fluorinated tetraethyl orthosilicate, and
wherein the continuous metal layer comprises any of aluminum and an aluminum alloy.

8. A structure comprising:
multiple dielectric layers of interlayer dielectric material, wherein the multiple dielectric layers comprise: a first dielectric layer, a second dielectric layer, and a third dielectric layer; and
multiple metal levels comprising metal interconnect structures embedded in the multiple dielectric layers, wherein the metal levels comprise at least:
a lower metal level comprising: a first metal via extending through the first dielectric layer; and a first metal wire on the first dielectric layer and the first metal via, wherein the first metal via has a first shape; and
an upper metal level above the lower metal level and comprising:
a second metal via extending through the second dielectric layer, wherein the second dielectric layer has a first thickness, a first surface immediately adjacent to the first metal wire, and a second surface opposite the first surface, wherein the second metal via extends through the second dielectric layer from the second surface to the first surface and is in contact with the first metal wire, wherein the second metal via has a second shape that is different from the first shape, wherein the second shape has at least eight sides, and wherein, within the second shape, each interior angle at a junction between adjacent sides is at least 135°;
a second metal wire on the second surface of the second dielectric layer and electrically connected to the second metal via, wherein the second metal wire and the second metal via comprise respective portions of a continuous metal layer above the second dielectric layer and lining a via opening in the second dielectric layer, wherein the continuous metal layer has a second thickness that is less than the first thickness of the second dielectric layer, and wherein the first metal via and the first metal wire in the lower metal level comprise a first metal material and the second metal via and the second metal wire in the upper metal level comprise a second metal material that is different from the first metal material;
a first passivation layer coating a top surface of the continuous metal layer, wherein the first passivation layer is above the second surface of the dielectric layer and extends into the via opening below the second surface of the dielectric layer; and
a second passivation layer on the first passivation layer, wherein the first passivation layer and the second passivation layer are each thinner than the continuous metal layer and wherein the third dielectric layer is on the second passivation layer.

9. The structure of claim 8, wherein the continuous metal layer is devoid of bulges around edges of the via opening at the second surface of the second dielectric layer such that the first passivation layer completely coats the top surface of the continuous metal layer.

10. The structure of claim 8, wherein the at least eight sides of the second metal via have equal lengths.

11. The structure of claim 8, wherein the at least eight sides of the second metal via comprise alternating first sides and second sides, and wherein the first sides have a first length and the second sides have a second length that is less than the first length.

12. The structure of claim 11, wherein the second length is at least one-third a height of the second metal via.

13. The structure of claim 8, wherein the second metal via has an aspect ratio of 1 to at least four.

14. The structure of claim 8,
wherein the interlayer dielectric material comprises any of borophosphosilicate glass, tetraethyl orthosilicate, and fluorinated tetraethyl orthosilicate,
wherein the first passivation layer comprises silicon dioxide layer,
wherein the second passivation layer comprises silicon nitride, and
wherein the first metal material comprises copper and the second metal material comprises any of aluminum and an aluminum alloy.

15. A method comprising:
forming multiple metal levels comprising metal interconnect structures embedded in multiple dielectric layers of interlayer dielectric material, wherein the multiple dielectric layers comprise: a first dielectric layer, a second dielectric layer, and a third dielectric layer and wherein the forming of the multiple metal levels comprises:
forming a lower metal level comprising: a first metal via extending through the first dielectric layer; and a first metal wire on the first dielectric layer and the first metal via, wherein the first metal via has a first shape; and
forming an upper metal level above the lower metal level, wherein the upper metal level comprises:
a second metal via extending through the second dielectric layer, wherein the second dielectric layer has a first thickness, a first surface immediately adjacent to the first metal wire, and a second surface opposite the first surface wherein the second metal via extends through the second dielectric layer from the second surface to the first surface and is in contact with the first metal wire, wherein the second metal via has a second shape that is different from the first shape, wherein the second shape has at least eight sides, and wherein, within the second shape, each interior angle at a junction between adjacent sides is at least 135°;
a second metal wire on the second surface of the second dielectric layer and electrically connected to the second metal via, wherein the second metal wire and the second metal via comprise respective portions of a continuous metal layer above the second dielectric layer and lining a via opening in the second dielectric layer, wherein the continuous metal layer has a second thickness that is less than the first thickness, and wherein the first metal via and the first metal wire in the lower metal level comprise a first metal material and the second metal via and the second metal wire in the upper metal level comprise a second metal material that is different from the first metal material;
a first passivation layer coating a top surface of the continuous metal layer, wherein the first passivation layer is above the second surface of the second dielectric layer and extends into the via opening below the second surface of the dielectric layer; and
a second passivation layer on the first passivation layer, wherein the first passivation layer and the second passivation layer are each thinner than the continuous metal layer and wherein the third dielectric layer is on the second passivation layer.

16. The method of claim 15, wherein the forming of the upper metal level comprises forming the via opening in the second dielectric layer and wherein the forming of the via opening comprises forming the via opening with eight sides and such that all sides having equal lengths.

17. The method of claim 15, wherein the forming of the upper metal level comprises forming the via opening in the second dielectric layer and wherein the forming of the via opening comprises forming the via opening with eight sides, with alternating first sides with a first length and second sides with a second length that is less than the first length, and wherein the second length is at least one-third a height of the metal via.

18. The method of claim 15, wherein the forming of the upper metal level comprises forming the via opening in the second dielectric layer and wherein the forming of the via opening is performed such that the via opening has an aspect ratio of one to at least four.

19. The method of claim 18, wherein the continuous metal layer is conformally deposited by physical vapor deposition so as to be devoid of bulges around edges of the via opening at the second surface of the second dielectric layer and the first passivation layer is formed by chemical vapor deposition so as to completely coat the top surface of the continuous metal layer.

20. The method of claim 15,
wherein the interlayer dielectric material comprises any of borophosphosilicate glass, tetraethyl orthosilicate, and fluorinated tetraethyl orthosilicate,
wherein the first passivation layer comprises silicon dioxide layer,
wherein the second passivation layer comprises silicon nitride layer, and
wherein the first metal material comprises copper and the second metal material comprises any of aluminum and an aluminum alloy.

\* \* \* \* \*